(12) United States Patent
Brew et al.

(10) Patent No.: US 11,158,788 B2
(45) Date of Patent: Oct. 26, 2021

(54) ATOMIC LAYER DEPOSITION AND PHYSICAL VAPOR DEPOSITION BILAYER FOR ADDITIVE PATTERNING

(71) Applicant: International Business Machines Corporation, Armonk, NY (US)

(72) Inventors: Kevin W. Brew, Albany, NY (US); Iqbal Rashid Saraf, Cobleskill, NY (US); Injo Ok, Loudonville, NY (US); Nicole Saulnier, Albany, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/175,088

(22) Filed: Oct. 30, 2018

(65) Prior Publication Data
US 2020/0135807 A1 Apr. 30, 2020

(51) Int. Cl.
| | |
|---|---|
| *H01L 45/00* | (2006.01) |
| *G11C 13/00* | (2006.01) |
| *G11C 11/56* | (2006.01) |
| *H01L 21/033* | (2006.01) |
| *H01L 21/027* | (2006.01) |
| *H01L 21/3213* | (2006.01) |
| *H01L 21/768* | (2006.01) |

(52) U.S. Cl.
CPC ...... *H01L 45/1253* (2013.01); *G11C 13/0004* (2013.01); *G11C 13/0007* (2013.01); *G11C 13/0011* (2013.01); *H01L 21/0276* (2013.01); *H01L 21/0332* (2013.01); *H01L 45/06* (2013.01); *H01L 45/085* (2013.01); *H01L 45/124* (2013.01); *H01L 45/1683* (2013.01); *G11C 11/5685* (2013.01); *H01L 21/32139* (2013.01); *H01L 21/76838* (2013.01); *H01L 45/144* (2013.01); *H01L 45/147* (2013.01)

(58) Field of Classification Search
CPC ............... H01L 45/124; H01L 45/1683; H01L 45/1253; H01L 45/126; H01L 21/32136; H01L 21/32139; H01L 21/0332; H01L 21/0276; H01L 45/085; H01L 45/06; H01L 45/144; H01L 29/40117; H01L 29/401; H01L 29/4011; G11C 11/5614; G11C 11/5685; G11C 13/0011; G11C 13/0007

See application file for complete search history.

(56) References Cited

U.S. PATENT DOCUMENTS

| | | | |
|---|---|---|---|
| 4,844,592 A * | 7/1989 | Demirvont | ............ G02F 1/1523 359/265 |
| 5,219,788 A | 6/1993 | Abernathey et al. | |

(Continued)

FOREIGN PATENT DOCUMENTS

CN 1652319 A 8/2005

*Primary Examiner* — Sophia T Nguyen
(74) *Attorney, Agent, or Firm* — Randall Bluestone; Ryan, Mason & Lewis, LLP (57) ABSTRACT

A method for manufacturing a semiconductor device includes forming a memory element in a dielectric layer. A first conductive layer is deposited on the dielectric layer and the memory element by atomic layer deposition, and a second conductive layer is deposited on the first conductive layer by physical vapor deposition. In the method, the first and second conductive layers are patterned into an electrode on the memory element.

13 Claims, 6 Drawing Sheets

(56) References Cited

U.S. PATENT DOCUMENTS

| | | | |
|---|---|---|---|
| 5,585,959 A * | 12/1996 | Brown | C09K 9/00 359/265 |
| 6,043,163 A * | 3/2000 | Tsai | H01L 21/32136 257/E21.311 |
| 6,169,030 B1 | 1/2001 | Naik et al. | |
| 6,420,099 B1 * | 7/2002 | Gutsche | H01L 21/32139 216/100 |
| 6,562,715 B1 | 5/2003 | Chen et al. | |
| 6,909,107 B2 * | 6/2005 | Rodgers | H01L 21/76805 257/3 |
| 6,919,592 B2 * | 7/2005 | Segal | B82Y 10/00 257/209 |
| 7,109,056 B2 * | 9/2006 | Klein | C23C 18/165 257/E31.029 |
| 7,179,760 B2 | 2/2007 | Conti et al. | |
| 7,186,446 B2 | 3/2007 | Kim et al. | |
| 7,394,089 B2 * | 7/2008 | Doyle | G11C 13/0004 257/209 |
| 7,399,712 B1 * | 7/2008 | Graff | H01L 21/31144 257/E21.257 |
| 7,791,058 B2 * | 9/2010 | Liu | H01L 45/06 257/2 |
| 7,867,815 B2 * | 1/2011 | Lung | G11C 13/0004 257/E21.068 |
| 7,884,346 B2 * | 2/2011 | Mikawa | H01L 27/101 257/4 |
| 8,208,294 B2 * | 6/2012 | Happ | H01L 45/06 365/148 |
| 8,552,412 B2 * | 10/2013 | Park | H01L 45/06 257/4 |
| 8,613,863 B2 * | 12/2013 | Tong | H01L 21/32134 216/57 |
| 8,816,314 B2 * | 8/2014 | Gopalan | H01L 45/1266 257/2 |
| 8,995,170 B2 * | 3/2015 | Kawashima | H01L 27/101 365/148 |
| 9,034,689 B2 | 5/2015 | Sekar et al. | |
| 9,041,131 B2 | 5/2015 | Li et al. | |
| 9,099,633 B2 * | 8/2015 | Gopalan | H01L 45/04 |
| 9,196,828 B2 * | 11/2015 | Lee | H01L 45/1253 |
| 9,299,747 B1 * | 3/2016 | Pellizzer | H01L 27/2463 |
| 9,318,437 B1 * | 4/2016 | He | H01L 23/53238 |
| 9,514,942 B1 * | 12/2016 | Smith | H01L 27/0924 |
| 9,564,446 B1 * | 2/2017 | Weybright | H01L 27/1104 |
| 9,985,206 B1 * | 5/2018 | Ando | H01L 45/146 |
| 10,141,503 B1 * | 11/2018 | BrightSky | H01L 45/1246 |
| 10,475,997 B1 * | 11/2019 | Ando | H01L 45/04 |
| 2002/0195416 A1 * | 12/2002 | Nallan | H01L 21/32136 216/2 |
| 2003/0082908 A1 * | 5/2003 | Lowrey | H01L 45/06 438/652 |
| 2004/0043620 A1 * | 3/2004 | Ying | H01L 21/02071 438/710 |
| 2004/0165422 A1 * | 8/2004 | Hideki | H01L 45/143 365/163 |
| 2004/0166691 A1 * | 8/2004 | Nieh | H01L 21/32139 438/745 |
| 2004/0266204 A1 * | 12/2004 | Lim | H01L 21/0276 438/706 |
| 2005/0006681 A1 * | 1/2005 | Okuno | H01L 45/06 257/295 |
| 2005/0074933 A1 * | 4/2005 | Lowrey | H01L 45/06 438/200 |
| 2005/0127347 A1 * | 6/2005 | Choi | H01L 21/7684 257/2 |
| 2005/0174835 A1 * | 8/2005 | Rinerson | H01L 45/146 365/171 |
| 2005/0212037 A1 * | 9/2005 | Pinnow | H01L 45/124 257/326 |
| 2005/0287802 A1 * | 12/2005 | Kim | H01L 27/10891 438/672 |
| 2006/0118913 A1 * | 6/2006 | Yi | H01L 45/144 257/613 |
| 2006/0163553 A1 * | 7/2006 | Liang | H01L 45/06 257/3 |
| 2006/0270245 A1 | 11/2006 | Conti et al. | |
| 2006/0292886 A1 * | 12/2006 | Nam | H01L 27/105 438/725 |
| 2007/0012905 A1 * | 1/2007 | Huang | H01L 45/06 257/2 |
| 2007/0111429 A1 * | 5/2007 | Lung | H01L 45/1691 438/238 |
| 2007/0194301 A1 * | 8/2007 | Sezi | B82Y 10/00 257/40 |
| 2008/0014676 A1 * | 1/2008 | Lung | H01L 45/06 438/95 |
| 2008/0061282 A1 * | 3/2008 | Sato | H01L 45/06 257/4 |
| 2008/0064199 A1 * | 3/2008 | Park | H01L 21/31116 438/597 |
| 2008/0164526 A1 * | 7/2008 | Wang | H01L 21/0338 257/352 |
| 2008/0265238 A1 * | 10/2008 | Chen | H01L 45/1666 257/3 |
| 2008/0283812 A1 * | 11/2008 | Liu | H01L 45/06 257/2 |
| 2008/0314739 A1 * | 12/2008 | Gopalakrishnan | C23C 18/1204 204/247.4 |
| 2009/0072215 A1 * | 3/2009 | Lung | H01L 45/122 257/5 |
| 2009/0072216 A1 * | 3/2009 | Lung | H01L 45/144 257/4 |
| 2009/0097305 A1 * | 4/2009 | Bae | C23C 16/305 365/163 |
| 2009/0127653 A1 * | 5/2009 | Ryu | H01L 45/1683 257/528 |
| 2009/0179184 A1 * | 7/2009 | Liu | H01L 45/1226 257/2 |
| 2009/0186475 A1 * | 7/2009 | Ting | H01L 21/823814 438/595 |
| 2009/0197422 A1 * | 8/2009 | Kang | H01L 21/76808 438/717 |
| 2010/0090192 A1 * | 4/2010 | Goux | B82Y 10/00 257/4 |
| 2010/0090193 A1 * | 4/2010 | Mikawa | H01L 27/101 257/4 |
| 2010/0167021 A1 * | 7/2010 | Lee | H01L 21/0332 428/195.1 |
| 2010/0176365 A1 * | 7/2010 | Park | H01L 27/2409 257/3 |
| 2011/0024874 A1 * | 2/2011 | Park | H01L 28/91 257/532 |
| 2011/0186798 A1 * | 8/2011 | Kwon | H01L 45/1691 257/2 |
| 2011/0303639 A1 * | 12/2011 | Ng | H01L 21/32136 216/41 |
| 2012/0012944 A1 * | 1/2012 | Yi | H01L 27/0688 257/390 |
| 2012/0019980 A1 * | 1/2012 | Cho | H01L 27/10852 361/311 |
| 2012/0115331 A1 * | 5/2012 | Koh | H01L 21/0332 438/694 |
| 2012/0196446 A1 * | 8/2012 | Graff | H01L 21/31122 438/725 |
| 2012/0244693 A1 * | 9/2012 | Luong | H01L 21/32138 438/591 |
| 2012/0273741 A1 * | 11/2012 | Hwang | H01L 45/06 257/2 |
| 2012/0275080 A1 * | 11/2012 | Dunn | H01G 4/228 361/301.4 |
| 2013/0122651 A1 * | 5/2013 | Fujii | H01L 45/1616 438/104 |
| 2013/0126984 A1 * | 5/2013 | Reimer | H01L 21/0332 257/410 |
| 2013/0134374 A1 * | 5/2013 | Kim | H01L 45/1233 257/2 |

(56) References Cited

U.S. PATENT DOCUMENTS

| | | | |
|---|---|---|---|
| 2013/0137275 A1* | 5/2013 | Tong | H01L 21/32134 438/722 |
| 2013/0140515 A1* | 6/2013 | Kawashima | H01L 45/085 257/4 |
| 2013/0214391 A1* | 8/2013 | Choi | H01L 21/76816 257/622 |
| 2014/0015143 A1* | 1/2014 | Liu | H01L 43/02 257/774 |
| 2014/0035143 A1* | 2/2014 | Lee | H01L 21/76802 257/751 |
| 2014/0070163 A1* | 3/2014 | Nodin | H01L 45/06 257/4 |
| 2014/0151628 A1* | 6/2014 | Li | H01L 45/1253 257/4 |
| 2014/0197368 A1* | 7/2014 | Yoneda | H01L 45/08 257/2 |
| 2014/0198565 A1* | 7/2014 | Pellizzer | G11C 13/0004 365/163 |
| 2014/0199628 A1* | 7/2014 | Edelstein | G03F 7/094 430/270.1 |
| 2014/0203236 A1* | 7/2014 | Chen | H01L 45/16 257/4 |
| 2014/0252628 A1* | 9/2014 | Huang | H01L 21/32133 257/758 |
| 2014/0291597 A1* | 10/2014 | Song | H01L 45/06 257/2 |
| 2014/0332962 A1* | 11/2014 | Lee | H01L 21/76802 257/751 |
| 2014/0356549 A1* | 12/2014 | Varadarajan | H01L 21/02126 427/568 |
| 2015/0017808 A1* | 1/2015 | Koh | H01L 21/31144 438/703 |
| 2015/0144862 A1* | 5/2015 | Choi | H01L 27/2436 257/4 |
| 2015/0187700 A1* | 7/2015 | Shao | H01L 21/76846 257/762 |
| 2015/0200353 A1* | 7/2015 | Zhang | H01L 43/12 257/421 |
| 2015/0206585 A1* | 7/2015 | Kim | H01L 45/141 711/103 |
| 2015/0214331 A1* | 7/2015 | Jang | H01L 29/6656 438/164 |
| 2015/0243884 A1* | 8/2015 | BrightSky | H01L 45/06 257/4 |
| 2015/0318333 A1* | 11/2015 | Narayanan | H01L 45/16 257/4 |
| 2016/0172231 A1* | 6/2016 | Lee | H01L 21/31111 438/643 |
| 2016/0372413 A1 | 12/2016 | Mahalingam et al. | |
| 2017/0092735 A1* | 3/2017 | Hashemi | H01L 29/6656 |
| 2017/0125673 A1* | 5/2017 | Hsu | H01L 45/08 |
| 2017/0236869 A1* | 8/2017 | Tran | H01L 27/2436 257/4 |
| 2017/0256712 A1* | 9/2017 | Chen | H01L 45/04 |
| 2017/0263450 A1 | 9/2017 | Swaminathan et al. | |
| 2017/0279036 A1* | 9/2017 | Mo | H01L 43/08 |
| 2018/0096888 A1* | 4/2018 | Naik | H01L 21/76849 |
| 2018/0145253 A1* | 5/2018 | Zhou | H01L 45/16 |
| 2018/0203355 A1* | 7/2018 | De Silva | G03F 7/11 |
| 2018/0323072 A1* | 11/2018 | Raley | H01L 21/3081 |
| 2019/0019795 A1* | 1/2019 | Takesako | H01L 27/10814 |
| 2019/0096672 A1* | 3/2019 | Luong | H01L 21/0337 |
| 2019/0123270 A1* | 4/2019 | Mo | H01L 45/124 |
| 2019/0131458 A1* | 5/2019 | Yoo | H01L 45/06 |
| 2019/0157556 A1* | 5/2019 | BrightSky | H01L 27/2463 |
| 2019/0165265 A1* | 5/2019 | Yen | H01L 45/1675 |
| 2019/0245543 A1* | 8/2019 | Lee | H01L 23/49811 |
| 2019/0259753 A1* | 8/2019 | Yu | H01L 21/28088 |
| 2019/0272874 A1* | 9/2019 | Dananjaya | H01L 27/24 |
| 2019/0273147 A1* | 9/2019 | Cheng | H01L 21/02247 |
| 2019/0341257 A1* | 11/2019 | Raley | H01L 21/0338 |
| 2020/0006649 A1* | 1/2020 | Jiang | H01L 45/124 |
| 2020/0098581 A1* | 3/2020 | Xu | G03F 1/22 |
| 2020/0135807 A1* | 4/2020 | Brew | H01L 45/124 |

\* cited by examiner

ATOMIC LAYER DEPOSITION AND PHYSICAL VAPOR DEPOSITION BILAYER FOR ADDITIVE PATTERNING

BACKGROUND

Cognitive (e.g., memory) devices may contain materials that cannot be dry etched in fabrication facilities via reactive ion etching (ME) due to safety and chamber contamination concerns. Such materials can include, for example, phase change material (PCM), such as germanium-antimony-tellurium (GeSbTe), ovonic threshold switch (OTS) material including, for example, silicon germanium arsenide selenide (SiGeAsSe), and electrochemical metallization (ECM) material, such as AgGeSe. Additive patterning integrations allow capping these materials with a conductive electrode.

Physical vapor deposition (PVD) is a facile way to deposit metal/metal nitrides forming the conductive electrodes at low temperatures which are compatible with low-temperature technologies. However, PVD deposited films often damage common dielectrics (e.g., low-k dielectrics) that surround the memory materials (e.g., memory elements). Subsequent wet processing from additive patterning integration often removes the damaged dielectric, leading to unwanted recesses in the dielectric layer adjacent to the conductive electrodes. The recesses in the dielectric layer can expose sensitive memory elements to the environment, which can negatively impact device performance.

Accordingly, there is a need for techniques to form electrodes on memory materials which allows for low temperature processing while avoiding damage to surrounding dielectric layers.

SUMMARY

According to an exemplary embodiment of the present invention, a method for manufacturing a semiconductor device includes forming a memory element in a dielectric layer. A first conductive layer is deposited on the dielectric layer and the memory element by atomic layer deposition, and a second conductive layer is deposited on the first conductive layer by physical vapor deposition. In the method, the first and second conductive layers are patterned into an electrode on the memory element.

According to an exemplary embodiment of the present invention, a method for manufacturing a semiconductor device includes forming a phase change material in a dielectric layer, and forming a bottom electrode under the phase change material. In the method, a conductive liner layer is deposited on the dielectric layer and the phase change material by atomic layer deposition, and a conductive layer is deposited on the conductive liner layer. The method further includes patterning the conductive liner layer and the conductive layer into a top electrode on the phase change material.

According to an exemplary embodiment of the present invention, a method for manufacturing a semiconductor device includes forming a contact in a first dielectric layer, and forming a bottom electrode on the contact. In the method, a second dielectric layer including a low-k dielectric is formed on the first dielectric layer. A memory element is formed on the bottom electrode, and is surrounded by the second dielectric layer. The method further includes depositing by atomic layer deposition a first conductive layer on the second dielectric layer and the memory element, and depositing a second conductive layer on the first conductive layer. The first and second conductive layers are patterned into a top electrode on the memory element.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to methods and structures to prevent recessing (e.g., gouge) in a dielectric layer surrounding a storage element, while still gaining the electrical benefits of using low-k materials for memory elements.

It is to be understood that the various layers and/or regions shown in the accompanying drawings are not drawn to scale, and that one or more layers and/or regions of a type commonly used in, for example, phase-change memory (PCM), phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to PCM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views or images measured from a bottom surface to a top surface of the element, and/or measured with respect to a surface on which the element is located. Conversely, a "depth" refers to a vertical size of an element (e.g., a layer, trench, hole, opening, etc.) in the cross-sectional views or images measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of a layer or substrate in the cross-sectional views or images, and "horizontal" refers to a direction parallel to the top surface of a layer or substrate in the cross-sectional views or images.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

In accordance with an embodiment of the present invention, an atomic layer deposition (ALD) film is deposited on a memory element (e.g., PCM, OTS, etc.) and a surrounding dielectric layer in which the memory element is formed. The ALD film is deposited between the dielectric layer and a subsequently deposited physical vapor deposition (PVD) film in order to protect the underlying dielectric layer from damage which can occur during patterning of the PVD film into a top electrode on the memory element. A bilayer of the PVD deposited film on the ALD deposited film is patterned into a top electrode on the memory element without damage to (e.g., unwanted recessing of) the dielectric layer. As a result of the dielectric layer remaining intact due to the protection afforded by the ALD film, the memory element is not exposed to the environment, and device degradation is prevented.

Figure 1:
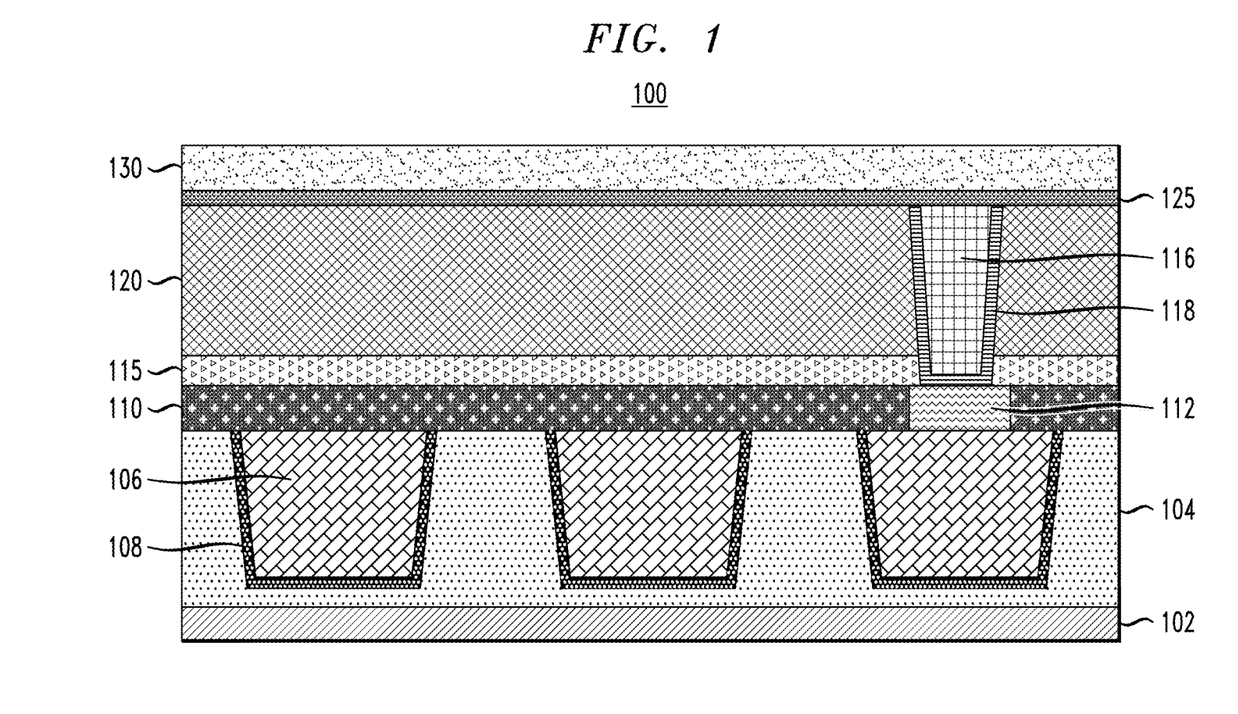
FIG. 1 is a schematic cross-sectional view illustrating manufacturing of a semiconductor device and showing deposition of an electrode bilayer, according to an embodiment of the invention.

FIG. 1 is a schematic cross-sectional view illustrating manufacturing of a semiconductor device and showing deposition of an electrode bilayer, according to an embodiment of the invention. Referring to FIG. 1, a semiconductor device 100 includes a plurality of conductive landing pads 106 (e.g., contacts) formed in a dielectric layer 104. The dielectric layer 104 includes, for example, tetraethyl orthosilicate (TEOS), silicon dioxide ($SiO_2$), carbon-doped silicon oxide (SiCOH), SiLK® dielectrics, and/or porous forms of these low-k dielectric films.

As can be understood by one of ordinary skill in the art, the dielectric layer 104 can be on a semiconductor substrate 102, with intervening layers (e.g., lower conductive lines, devices, etc.) between the dielectric layer 104 and the substrate 102. A semiconductor substrate 102 may comprise semiconductor material including, but not limited to, Si, SiGe, SiC, SiGeC or other like semiconductor. In addition, multiple layers of the semiconductor materials can be used as the semiconductor material of the substrate 102. A plurality of devices can be on the substrate 102, such as, for example, transistors, capacitors, and resistors.

A liner layer 108 comprising, for example titanium nitride, tantalum nitride or tungsten nitride is conformally formed on the sidewalls and bottom surfaces of trenches in which the landing pads 106 are formed. The landing pads 106 include, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof deposited on the liner layers 108 using deposition techniques, including, but not necessarily limited to, PVD, chemical vapor depositions (CVD), ALD or sputtering. In accordance with an embodiment of the present invention, the landing pads 106 can be electrically connected to or form contact lines, such as, for example, wordlines, of a resulting memory cell array. The number of landing pads 106 shown in the figures is illustrative, and the embodiments of the present invention are not necessarily limited to the number of landing pads shown.

As shown in FIG. 1, another dielectric layer 110 is formed on the dielectric layer 104 including the landing pads 106. The dielectric layer 110 includes, for example, $SiO_2$, SC6 silicon nitride (SiN), and has a thickness (e.g., vertical height) in the range of about 10 nm-about 40 nm, for example, about 20 nm. Another dielectric layer 115 includes, for example, NBLoK™ material from Applied Materials, Inc. of Santa Clara, Calif., which is a nitrogen-doped silicon carbide. The dielectric layer 115 is formed on the dielectric layer 110 using deposition techniques, including, but not necessarily limited to, PVD, CVD, ALD or sputtering. A thickness (e.g., vertical height) of the dielectric layer 115 is in the range of about 20 nm to about 30 nm.

A low-k dielectric layer 120 is formed on the dielectric layer 115 using, for example, deposition techniques, including, but not necessarily limited to, PVD, CVD, ALD or sputtering. According to an embodiment of the present invention, the low-k dielectric layer 120 includes, for example, TEOS, $SiO_2$, SiCOH, SiLK® dielectrics, and/or porous forms of these low-k dielectric films. A thickness (e.g., vertical height) of the low-k dielectric layer 120 is in the range of about 100 nm to about 120 nm.

As can be seen in FIG. 1, a memory element 116 including, for example, PCM (e.g. $Ge_2Sb_2Te_5$), OTS material (e.g. SiTe, ZnTe, $As_2Te_3$) and/or ECM material (e.g. $LiCoO_2$, $Li_4Ti_5O_{12}$) is formed through the dielectric layers 120 and 115 and contacts a bottom electrode 112 embedded in the dielectric layer 110.

The memory element 116 is deposited in a trench surrounded by the dielectric layers 120 and 115 and lined on side and bottom surfaces with a liner layer 118 including, for example, TaN or TiN deposited using techniques such as ALD or PVD. According to an embodiment of the present invention, a horizontal width of the bottom electrode is in the range of about 36 nm to about 56 nm, and includes, for example, TaN. A thickness of the bottom electrode is the same or substantially the same as a thickness of the dielectric layer 110, and the bottom electrode 112 is in electrical contact with the memory element 116 and a corresponding landing pad 106.

According to an embodiment of the present invention, a conductive liner layer 125 including, for example, ALD TaN, is deposited on the low-k dielectric layer 120 including the memory element 116 formed therein. The liner layer 125 can also be formed from ALD TiN or other conductive nitride, as long as the liner layer is an ALD film with low reactivity. The liner layer 125 has a thickness (e.g., vertical height) in the range of about 3 nm to about 5 nm so as to limit the liner layer 125 from contributing to a resistance of the device 100. The liner layer 125 is deposited using ALD. A conductive layer 130 is formed on the conductive liner layer 125. In accordance with an embodiment of the present invention, the conductive layer 130 includes, for example, PVD TaN or a PVD TiN/TaN bilayer, and has a thickness (e.g., vertical height) in the range of about 20 nm to about 30 nm. The conductive layer 130 is deposited using PVD. As noted herein, the liner layer 125 functions as a protective layer for the low-k dielectric layer 120 to protect the underlying low-k dielectric layer 120 from damage which can occur during patterning of the PVD conductive layer 130 on the liner layer 125 into a top electrode of the memory element 116.

Figure 2:
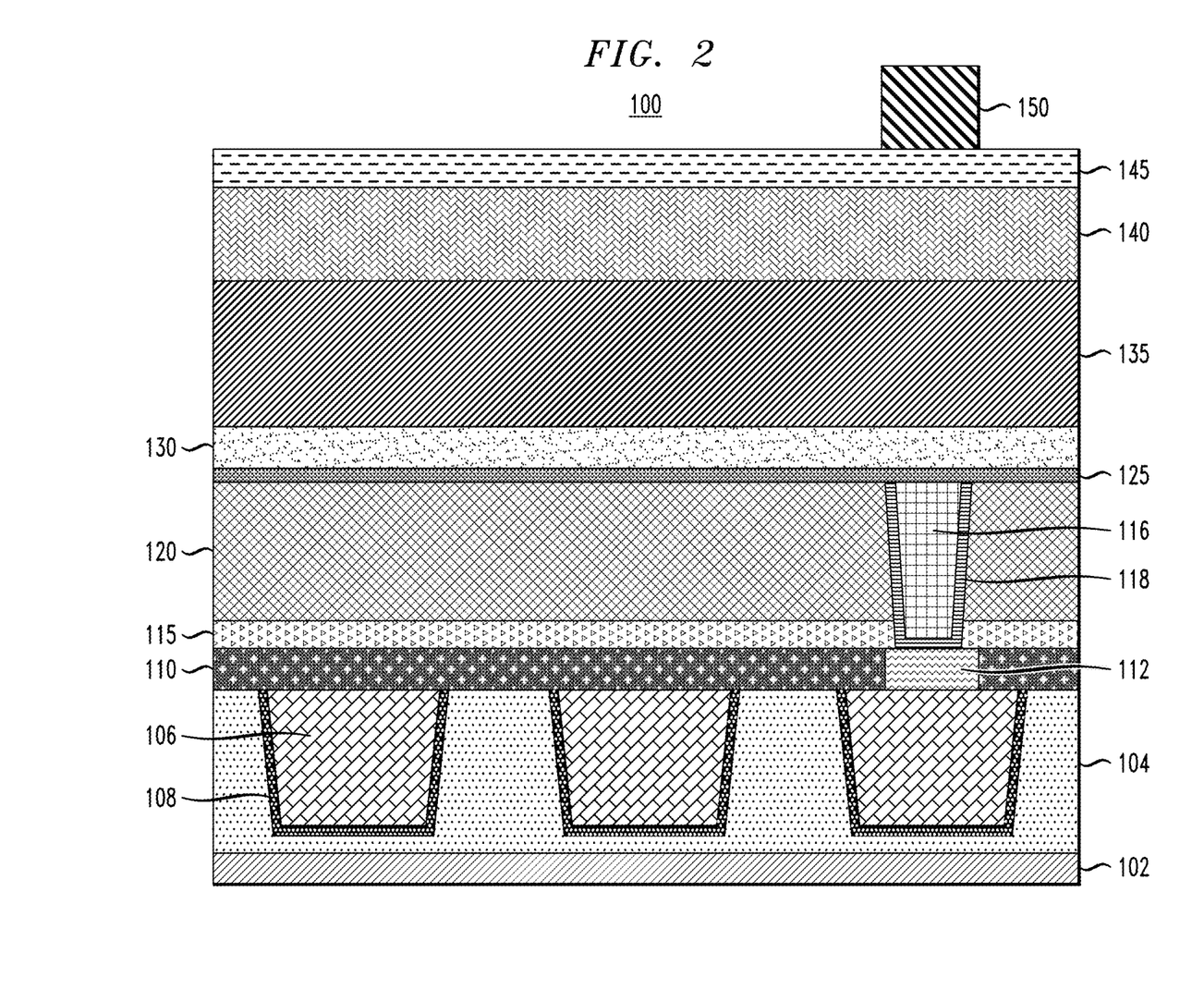
FIG. 2 is a schematic cross-sectional view illustrating manufacturing of a semiconductor device and showing deposition of a trilayer mask structure and a resist, according to an embodiment of the invention.

FIG. 2 is a schematic cross-sectional view illustrating manufacturing of a semiconductor device and showing deposition of a trilayer mask structure and a resist, according to an embodiment of the invention. Referring to FIG. 2, a trilayer mask structure includes a hardmask layer 135 formed on the conductive layer 130, an organic planarization layer (OPL) 140 formed on the hardmask layer and a silicon anti-reflective coating (SiARC) layer 145 formed on the OPL 140.

According to an embodiment of the present invention, the hardmask layer 135 includes, for example, SiN, silicon boron nitride (SiBN), siliconborocarbonitride (SiBCN) and/or silicon oxycarbonitride (SiOCN) and has a thickness (e.g., vertical height) in the range of about 50 nm-about 200 nm. The hardmask layer 135 is deposited by one or more deposition techniques, including, but not necessarily limited to, PVD, CVD, ALD or sputtering.

The OPL 140 comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 140 can be deposited, for example, by spin coating, to a thickness of about 100 nm-about 200 nm. The SiARC layer 145 is deposited on the OPL 140.

A resist 150 is formed on the SiARC layer 145 over the memory element 116. The resist has a thickness in the range of about 80 nm to about 110 nm, and horizontal width which corresponds to that of the bottom electrode 112 and the memory element 116.

Figure 3:
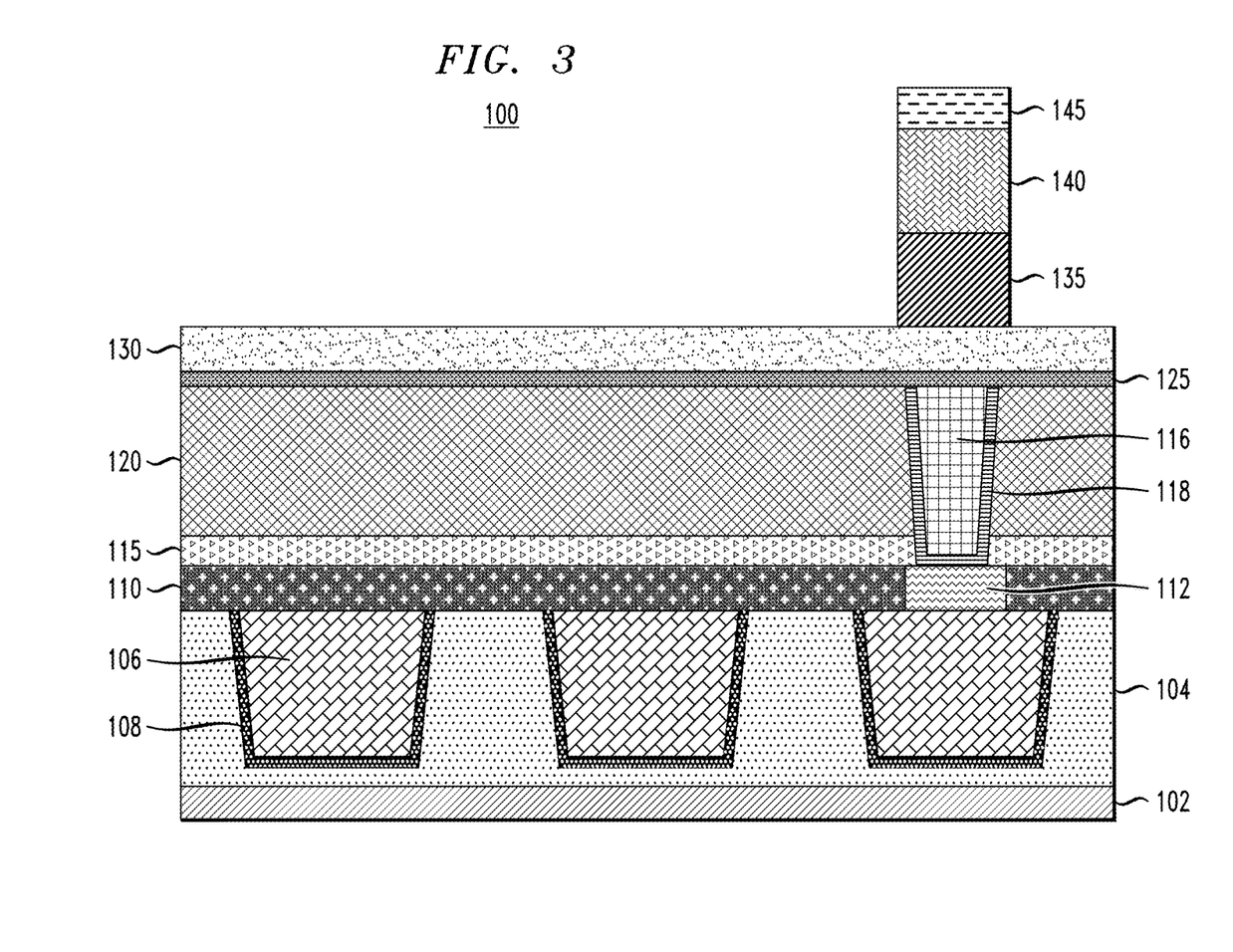
FIG. 3 is a schematic cross-sectional view illustrating manufacturing of a semiconductor device and showing patterning of the trilayer mask structure, according to an embodiment of the invention.

FIG. 3 is a schematic cross-sectional view illustrating manufacturing of a semiconductor device and showing patterning of the trilayer mask structure, according to an embodiment of the invention. Referring to FIG. 3, the trilayer mask structure including the stacked structure of the hardmask layer 135, the OPL 140 and the SiARC layer 145 is patterned by an etching process, which removes portions of the mask structure not covered by the resist 150. The etch process is performed using, for example, a fluorocarbon RIE to remove exposed portions of the trilayer mask structure down to the conductive layer 130.

Figure 4:
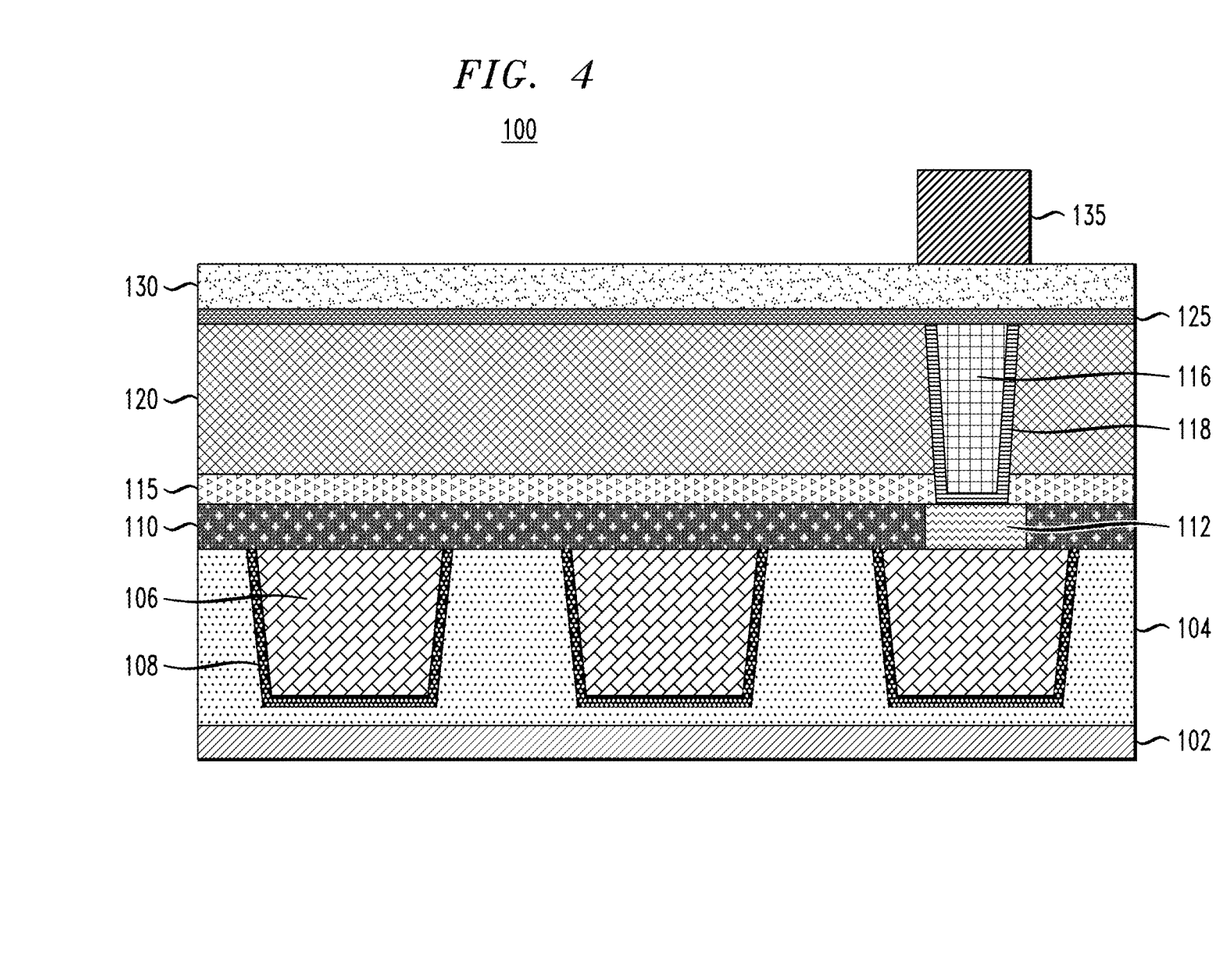
FIG. 4 is a schematic cross-sectional view illustrating manufacturing of a semiconductor device and showing removal of two uppermost layers of the mask structure, according to an embodiment of the invention.

FIG. 4 is a schematic cross-sectional view illustrating manufacturing of a semiconductor device and showing removal of two uppermost layers of the mask structure, according to an embodiment of the invention. Referring to FIG. 4, the OPL 140 and the SiARC layer 145 are removed from the hardmask layer 135 using, for example, oxygen plasma, nitrogen plasma, hydrogen plasma or other carbon strip or ashing process. The stripping process causes minimal or no damage to the remaining layers. As can be seen in FIG. 4, the patterned hardmask layer 135 remains covering the device area corresponding to the memory element 116 and the bottom electrode 112.

Figure 5:
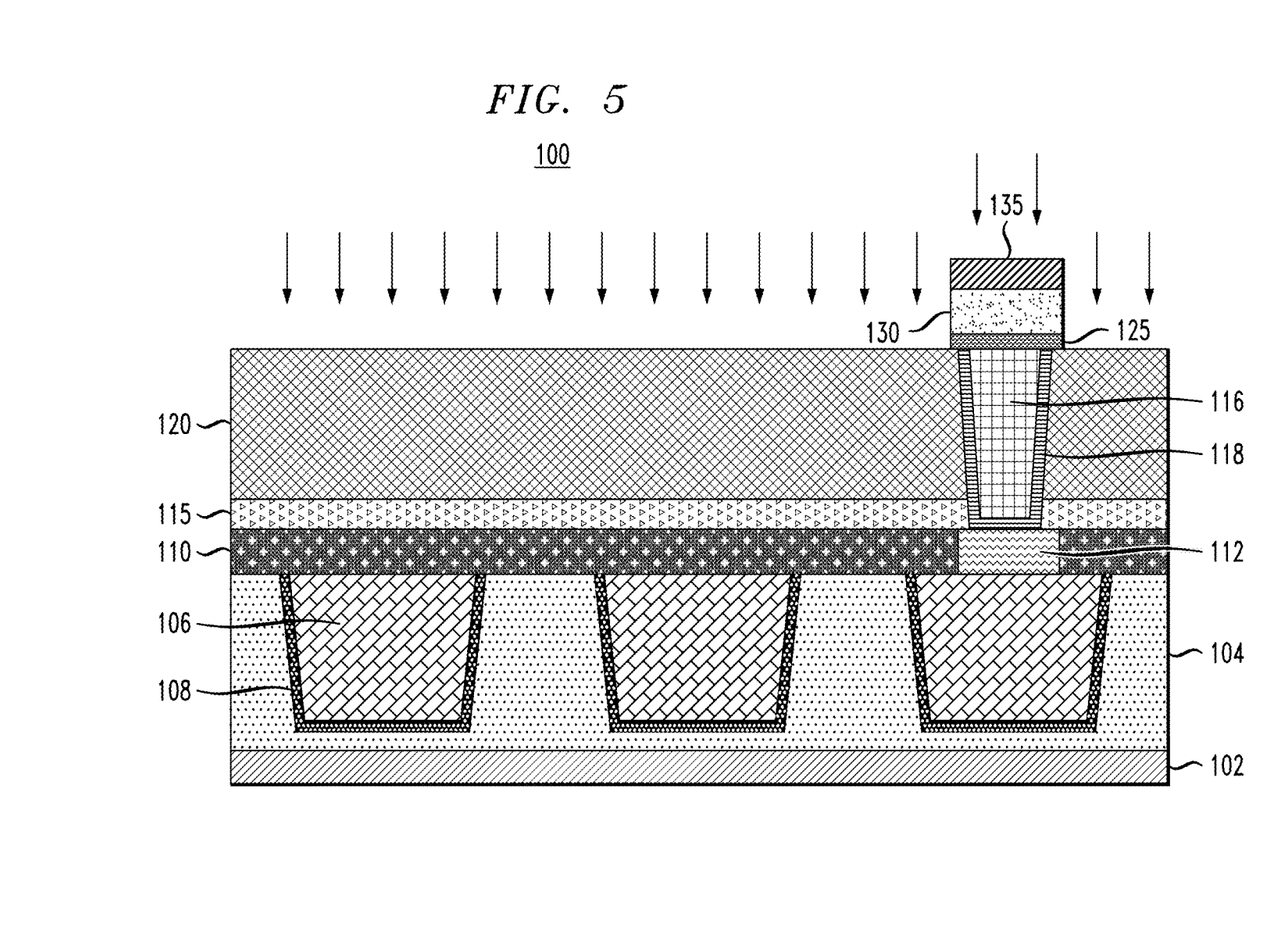
FIG. 5 is a schematic cross-sectional view illustrating manufacturing of a semiconductor device and showing patterning of the electrode bilayer under a hardmask layer, according to an embodiment of the invention.

FIG. 5 is a schematic cross-sectional view illustrating manufacturing of a semiconductor device and showing patterning of the electrode bilayer under a hardmask layer, according to an embodiment of the invention. Referring to FIG. 5, the conductive layer 130 and the underlying conductive liner layer 125 are patterned by a chlorine-based dry etching process (as shown by the arrows) into an electrode bilayer comprising the remaining portions of the conductive layer 130 (e.g., PVD TaN) and the conductive liner layer (e.g., ALD TaN) under the hardmask layer 135. The patterned layers 130 and 125 form a top electrode for the memory element 116 in a stacked bilayer structure. A thickness of the hardmask layer 135 is reduced as a result of the etching process, and following the etching, the hardmask layer 135 can be removed using, for example, diluted hydrofluoric acid (DHF). As illustrated in FIG. 5, due to the protection afforded by the ALD liner layer 125, the dielectric layer 120 remains intact and does not include unwanted recesses following subtractive patterning of the stacked structure of the conductive layer 130 and the conductive liner layer 125 into the top electrode structure. The subtractive patterning removes exposed portions of the conductive layer 130 and the conductive liner layer 125.

Subsequent downstream processing can be performed to form a contact to the top electrode structure comprising the layers 130 and 125. As can be understood, although one memory element is illustrated, the embodiments of the present invention are not necessarily limited thereto, and more than one memory element 116 and corresponding electrode bilayer structure can be formed by the techniques and processes according to embodiments of the present invention.

Figure 6:
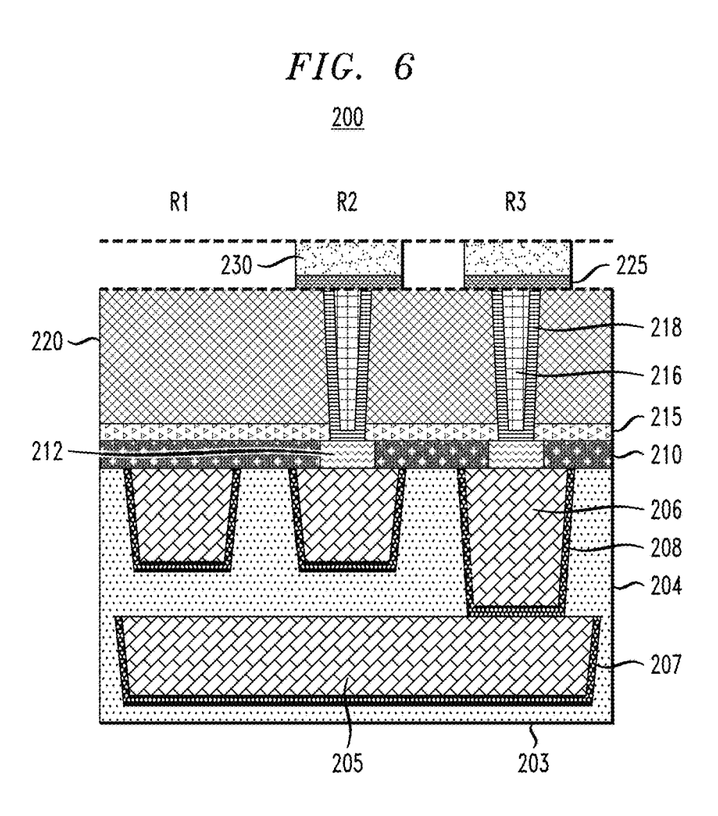
FIG. 6 is a schematic cross-sectional view illustrating a semiconductor device manufactured according to an embodiment of the invention.

FIG. 6 is a schematic cross-sectional view illustrating a semiconductor device manufactured according to an embodiment of the invention. Referring to FIG. 6, a device 200 is similar to the device 100 and includes similar reference numbers to FIGS. 1-5 referring to similar elements. For example, like the device 100, device 200 includes a plurality of landing pads 206 deposited on liner layers 208 in trenches formed in a dielectric layer 204. Building up from the dielectric layer 204, device 200 has a similar structure to device 100 including dielectric layer 210, and dielectric layers 215 and 220. Device 200 illustrates two memory elements 216 formed on liner layers 218 in trenches through the dielectric layers 220 and 215 and connected to respective bottom electrodes 212 embedded in the dielectric layer 210. The device 200 further includes two top electrode structures each comprising a PVD conductive layer 230 and an underlying protective ALD conductive liner layer 225 corresponding to a memory element 216. As can be seen in FIG. 6, due to the protection afforded by the ALD liner layers 225, the dielectric layer 220 remains intact and does not include unwanted recesses following subtractive patterning of the stacked structure of the conductive layer 230 and the conductive liner layer 225 into the top electrode structures.

In addition to the metallization level including landing pads 206 in dielectric layer 204, device 200 further illustrates another metallization level below the landing pads 206 including a landing pad 205 (e.g., contact) formed on a liner 207 in a trench in a dielectric layer 203 including the same or similar materials as the dielectric layer 204. The landing pad 205 and liner 207 can include the same or similar materials as those of the landing pad and liner 206 and 208.

FIG. 6 shows three regions R1, R2 and R3 respectively referring to a logic region with no backend device (R1), a fill region with unconnected devices (e.g., not connected to landing pad 205) (R2), and a connected device region (e.g., connected to landing pad 205) (R3). The devices can include, but are not necessarily limited to, PCM, OTS and ECM devices.

Figure 7:
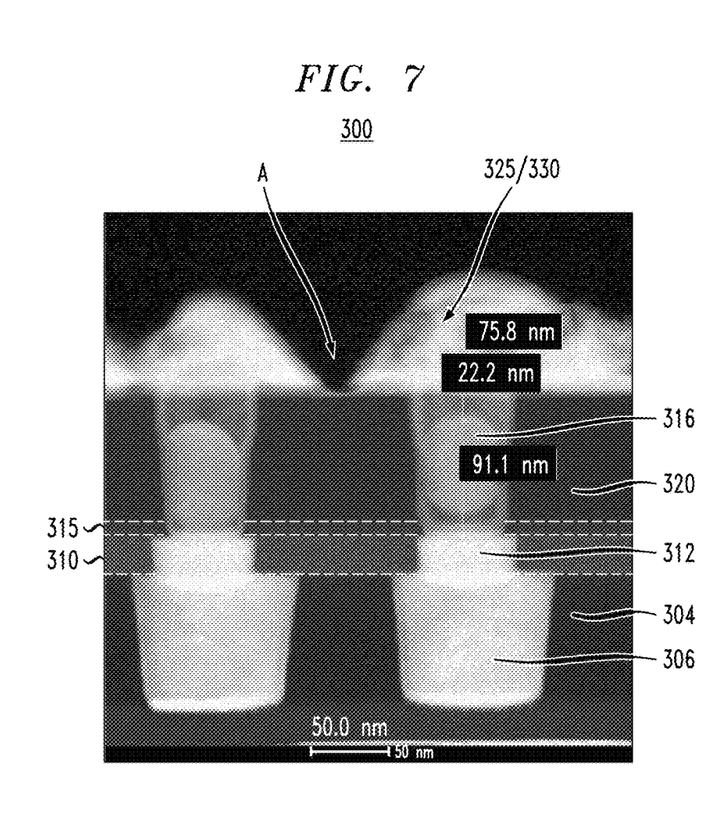
FIG. 7 is an image of a semiconductor device manufactured according to an embodiment of the invention.

FIG. 7 is an image of a semiconductor device manufactured according to an embodiment of the invention. Referring to FIG. 7, a device 300 is similar to the devices 100 and 200 and includes similar reference numbers to FIGS. 1-6 referring to similar elements. For example, like the devices 100 and 200, device 300 includes a plurality of landing pads 306 deposited on liner layers (not visible in FIG. 7) in trenches formed in a dielectric layer 304. Building up from the dielectric layer 304, device 300 has a similar structure to devices 100 and 200 including dielectric layer 310, and dielectric layers 315 and 320. Device 300 illustrates two memory elements 316 formed in trenches through the dielectric layers 320 and 315 and connected to respective bottom electrodes 312 embedded in the dielectric layer 310. The device 300 further includes two top electrode structures 330/325 each comprising a PVD conductive layer and an underlying protective ALD conductive liner layer (distinction between layers 330 and 325 not visible in FIG. 7) corresponding to a memory element 316. As can be seen in FIG. 7, due to the protection afforded by the ALD liner layers, the dielectric layer 320 remains intact and does not include unwanted recesses following subtractive patterning of the stacked structure of the conductive layer and the conductive liner layer into the top electrode structures 325/330.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a contact structure in a lower dielectric layer;
   forming a first dielectric layer on the lower dielectric layer and on the contact structure;
   forming a second dielectric layer on the first dielectric layer;
   forming a third dielectric layer on the second dielectric layer;
   forming a memory element in the second and third dielectric layers;
   wherein forming the memory element comprises:
      lining side and bottom surfaces of a trench in the second and third dielectric layers with a liner layer; and
      depositing the memory element in the trench and on the liner layer, wherein
   the memory element fills in a remaining portion of the trench;
   depositing by atomic layer deposition a first conductive layer on the third dielectric layer, the liner layer and the memory element;
   depositing by physical vapor deposition a second conductive layer on the first conductive layer;
   patterning the first and second conductive layers into an electrode on the memory element, wherein the patterning of the first and second conductive layers into the electrode comprises:
      forming a tri-layer mask structure on the second conductive layer;
      forming a photoresist on a first portion of the tri-layer mask structure;
      removing a second portion of the tri-layer mask structure to expose a first part of the second conductive layer;
      removing the photoresist and a top two layers of the first portion of the tri-layer mask structure, wherein a bottom layer of the first portion of the tri-layer mask structure remains on a second part of the second conductive layer disposed over the liner layer and the memory element;
      removing the exposed first part of the second conductive layer and an underlying portion of the first conductive layer with a dry etch process using the bottom layer of the first portion of the tri-layer mask structure as a mask; and removing the bottom layer of the first portion of the tri-layer mask structure from the second part of the second conductive layer;

forming a bottom electrode in the first dielectric layer under the memory element and on the contact structure;

wherein a width of the bottom electrode is less than a width of the contact structure;

wherein a portion of the liner layer is positioned between a bottom surface of the memory element and a top surface of the bottom electrode; and wherein the third dielectric layer comprises a different material from the second dielectric layer;

forming a second contact structure in the lower dielectric layer adjacent the contact structure; and forming a third contact structure in the lower dielectric layer adjacent the second contact structure;

wherein the first, second and third dielectric layers fill an area over the second and third contact structures and on a lateral side of the memory element and of the bottom electrode; and wherein, in at least one cross-section, the first, second and third dielectric layers completely fill the area over the second and third contact structures and on the lateral side of the memory element and of the bottom electrode.

2. The method according to claim 1, wherein the first conductive layer comprises tantalum nitride (TaN).

3. The method according to claim 2, wherein a thickness of the first conductive layer is in a range about 3 nm to about 5 nm.

4. The method according to claim 3, wherein the second conductive layer comprises TaN.

5. The method according to claim 4, wherein a thickness of the second conductive layer is in a range about 20 nm to about 30 nm.

6. The method according to claim 1, wherein the memory element comprises at least one of a phase change material, an ovonic threshold switch and electrochemical metallization material.

7. The method according to claim 1, wherein:
the bottom layer comprises a nitride layer on the second conductive layer as the bottom layer;
a first one of the top two layers comprises an organic planarization layer on the nitride layer; and
a second one of the top two layers comprises a silicon anti-reflective coating layer on the organic planarization layer.

8. The method according to claim 1, wherein the removing of the exposed first part of the second conductive layer and the underlying portion of the first conductive layer exposes portions of the third dielectric layer under the first part of the second conductive layer and the underlying portion of the first conductive layer.

9. The method according to claim 1, wherein the second dielectric layer comprises nitrogen-doped silicon carbide.

10. The method according to claim 1, wherein a bottom surface of the first conductive layer contacts a top surface of the memory element, a top surface of a first portion of the third dielectric layer on a first side of the memory element, a top surface of a second portion of the third dielectric layer on a second side of the memory element, a top surface of a first portion of the liner layer between the memory element and the first portion of the third dielectric layer, and a top surface of a second portion of the liner layer between the memory element and the second portion of the third dielectric layer.

11. A method for manufacturing a semiconductor device, comprising:
forming a contact structure in a lower dielectric layer;
forming a first dielectric layer on the lower dielectric layer and on the contact structure;
forming a second dielectric layer on the first dielectric layer;
forming a third dielectric layer on the second dielectric layer;
forming a phase change material in the second and third dielectric layers;
wherein forming the phase change material comprises:
lining side and bottom surfaces of a trench in the second and third dielectric layers with a liner layer; and
depositing the phase change material in the trench and on the liner layer,
wherein the phase change material fills in a remaining portion of the trench;
forming a bottom electrode in the first dielectric layer under the phase change material and on the contact structure;
depositing by atomic layer deposition a conductive liner layer on the third dielectric layer, the liner layer and the phase change material;
depositing a conductive layer on the conductive liner layer;
patterning the conductive liner layer and the conductive layer into a top electrode on the phase change material, wherein the patterning of the conductive liner layer and the conductive layer into the top electrode comprises:
forming a tri-layer mask structure on the conductive layer;
forming a photoresist on a first portion of the tri-layer mask structure;
removing a second portion of the tri-layer mask structure to expose a first part of the conductive layer;
removing the photoresist and a top two layers of the first portion of the tri-layer mask structure, wherein a bottom layer of the first portion of the tri-layer mask structure remains on a second part of the conductive layer disposed over the liner layer and the phase change material;
removing the exposed first part of the conductive layer and an underlying portion of the conductive liner layer with a dry etch process using the bottom layer of the first portion of the tri-layer mask structure as a mask; and
removing the bottom layer of the first portion of the tri-layer mask structure from the second part of the conductive layer;
wherein a width of the bottom electrode is less than a width of the contact structure;
wherein a portion of the liner layer is positioned between a bottom surface of the phase change material and a top surface of the bottom electrode; and
wherein the third dielectric layer comprises a different material from the second dielectric layer;
forming a second contact structure in the lower dielectric layer adjacent the contact structure; and
forming a third contact structure in the lower dielectric layer adjacent the second contact structure;

wherein the first, second and third dielectric layers fill an area over the second and third contact structures and on a lateral side of the phase change material and of the bottom electrode; and wherein, in at least one cross-section, the first, second and third dielectric layers completely fill the area over the second and third contact structures and on the lateral side of the phase change material and of the bottom electrode.

12. The method according to claim 11, wherein the conductive layer is deposited on the conductive liner layer by physical vapor deposition.

13. A method for manufacturing a semiconductor device, comprising:

forming a contact in a first dielectric layer;

forming a bottom electrode on the contact, wherein a width of the bottom electrode is less than a width of the contact;

forming a second dielectric layer on the first dielectric layer and on the contact;

forming a third dielectric layer on the second dielectric layer, wherein the third dielectric layer comprises a low-k dielectric;

forming a memory element on the bottom electrode, wherein the memory element is surrounded by the second and third dielectric layers;

wherein forming the memory element comprises:

lining side and bottom surfaces of a trench in the second and third dielectric layers with a liner layer; and depositing the memory element in the trench and on the liner layer, wherein the memory element fills in a remaining portion of the trench;

depositing by atomic layer deposition a first conductive layer on the third dielectric layer, the liner layer and the memory element;

depositing a second conductive layer on the first conductive layer;

patterning the first and second conductive layers into a top electrode on the memory element, wherein the patterning of the first and second conductive layers into the top electrode comprises:

forming a tri-layer mask structure on the second conductive layer;

forming a photoresist on a first portion of the tri-layer mask structure;

removing a second portion of the tri-layer mask structure to expose a first part of the second conductive layer;

removing the photoresist and a top two layers of the first portion of the tri-layer mask structure, wherein a bottom layer of the first portion of the tri-layer mask structure remains on a second part of the second conductive layer disposed over the liner layer and the memory element;

removing the exposed first part of the second conductive layer and an underlying portion of the first conductive layer with a dry etch process using the bottom layer of the first portion of the tri-layer mask structure as a mask; and removing the bottom layer of the first portion of the tri-layer mask structure from the second part of the second conductive layer;

wherein a portion of the liner layer is positioned between a bottom surface of the memory element and a top surface of the bottom electrode; and wherein the third dielectric layer comprises a different material from the second dielectric layer;

forming a second contact in the first dielectric layer adjacent the contact;

forming a third contact in the first dielectric layer adjacent the second contact; and wherein the second and third dielectric layers fill an area over the second and third contacts and on a lateral side of the memory element and of the bottom electrode; and wherein, in at least one cross-section, the second and third dielectric layers completely fill the area over the second and third contacts and on the lateral side of the memory element and of the bottom electrode.

* * * * *